May 12, 1959 E. Z. KOSTECKI 2,886,700

UHF-VHF TUNERS

Filed Feb. 4, 1953 3 Sheets-Sheet 1

INVENTOR.
EDWARD Z. KOSTECKI

Ostrolenk & Faber
ATTORNEYS

May 12, 1959 E. Z. KOSTECKI 2,886,700

UHF-VHF TUNERS

Filed Feb. 4, 1953 3 Sheets-Sheet 2

INVENTOR.
EDWARD Z. KOSTECKI

Ostrolenk & Faber
ATTORNEYS

INVENTOR.
EDWARD Z. KOSTECKI
BY
Ostrolenk & Faber
ATTORNEYS

United States Patent Office 2,886,700

Patented May 12, 1959

2,886,700

UHF-VHF TUNERS

Edward Z. Kostecki, Los Angeles, Calif., assignor to Standard Coil Products Co., Inc., Los Angeles, Calif., a corporation of Illinois Application February 4, 1953, Serial No. 335,046

1 Claim. (Cl. 250—20)

My present invention relates to television tuners and more particularly it relates to tuners for reception of very high and ultra-high frequency television signals.

The Federal Communications Commission recently allocated for commercial use a number of ultra-high frequency channels (470 to 890 megacycles) in addition to the already existing very high frequency channels (54 to 88 megacycles and 174 to 216 megacycles). By so doing, the F.C.C. extended the range of commercial television to a previously unused portion of the frequency spectrum.

Present day television receivers must, therefore, be provided with tuning elements capable of receiving channels through this wide frequency spectrum from VHF to UHF.

As is well known, there are two major trends in television tuners, namely, tuners using continuous tuning and tuners using switch tuning.

Continuous tuners which may use, for example, a transmission line and a movable shorting bar as the tuning element have the great disadvantage that they are not easily adjustable for selection of a television channel. This problem exists for VHF continuous tuners but becomes very important when the range of operation of continuous tuners is extended to the ultra-high frequency range.

It was found, in fact, that VHF—UHF continuous tuners required very critical adjustments by the operator because of the large number of channels (82) through which the tuner had to operate.

Switch tuners, on the other hand, are easily adjustable for reception of any desired channel but when extended for use also in the UHF band they become bulky and mechanically complex requiring in the case of switch tuners twenty-four sets of panels on two or more switching elements, one for the selection of arbitrarily divided television bands, the others for the selection of an individual channel in one of these bands.

This method provides, in other words, actually three tuning elements, a coarse tuning element to select a certain band in the VHF or UHF region and a fine tuning element to select a particular channel in a specific band, plus a still finer tuning control.

The major shortcoming found in these tuners was the relatively large bulk of the tuning elements: the coarse and fine tuners.

One object of the present invention is an easily adjustable compact VHF—UHF television tuner.

My present invention overcomes the above-mentioned difficulties by using what may be called a semi-continuous type of tuning.

Semi-continuous tuning when used in the present invention is the type of tuning in which the selection of a band in the VHF or UHF region is done by means of switches, while the selection of the individual channels in these bands is done continuously, for example, by means of a variable capacitance.

In one embodiment of my present invention I divide the 82 television channels into nine bands, four for the twelve VHF stations and five for the 70 UHF stations.

I provide a turret carrying a number of panels equal to the number of bands in which I have arbitrarily divided the VHF and UHF range so that the selection of one of these panels by rotation of the turret corresponds to the selection of a certain band, for example, the seventh band which in this embodiment corresponds to frequencies from 638 to 722 megacycles, that is, from channel 42 to channel 55.

I further provide a number of simultaneously variable capacitors which serve to tune in the desired frequency between 638 and 722 megacycles, for example 650 megacycles corresponding to channel 44.

The rotatable members of these variable capacitors are mounted on a shaft parallel to the turret shaft.

By this means I obtain a VHF—UHF tuner of very small dimensions which is also easy to operate since in each band in which the complete spectrum was arbitrarily divided there are at most fourteen channels which may then all be selected by a single rotation of the capacitors shaft.

In other words, in my novel tuner I limit continuous tuning to at most fourteen channels going as low as three channels in the low VHF bands.

By this means I arrive at a tuner of compact construction and with which VHF or UHF channels are easily selected.

At higher frequencies a smaller variation of capacitances causes a large variation in frequency as compared to the low frequency case I provide in my novel tuner means for limiting the variation of the fine tuning capacitances at different bands.

Another object of the present invention is a television tuner having a relatively small number of parts.

The foregoing and many other objects of my invention will become apparent in the following description and drawings in which.

Figures 1, 2:
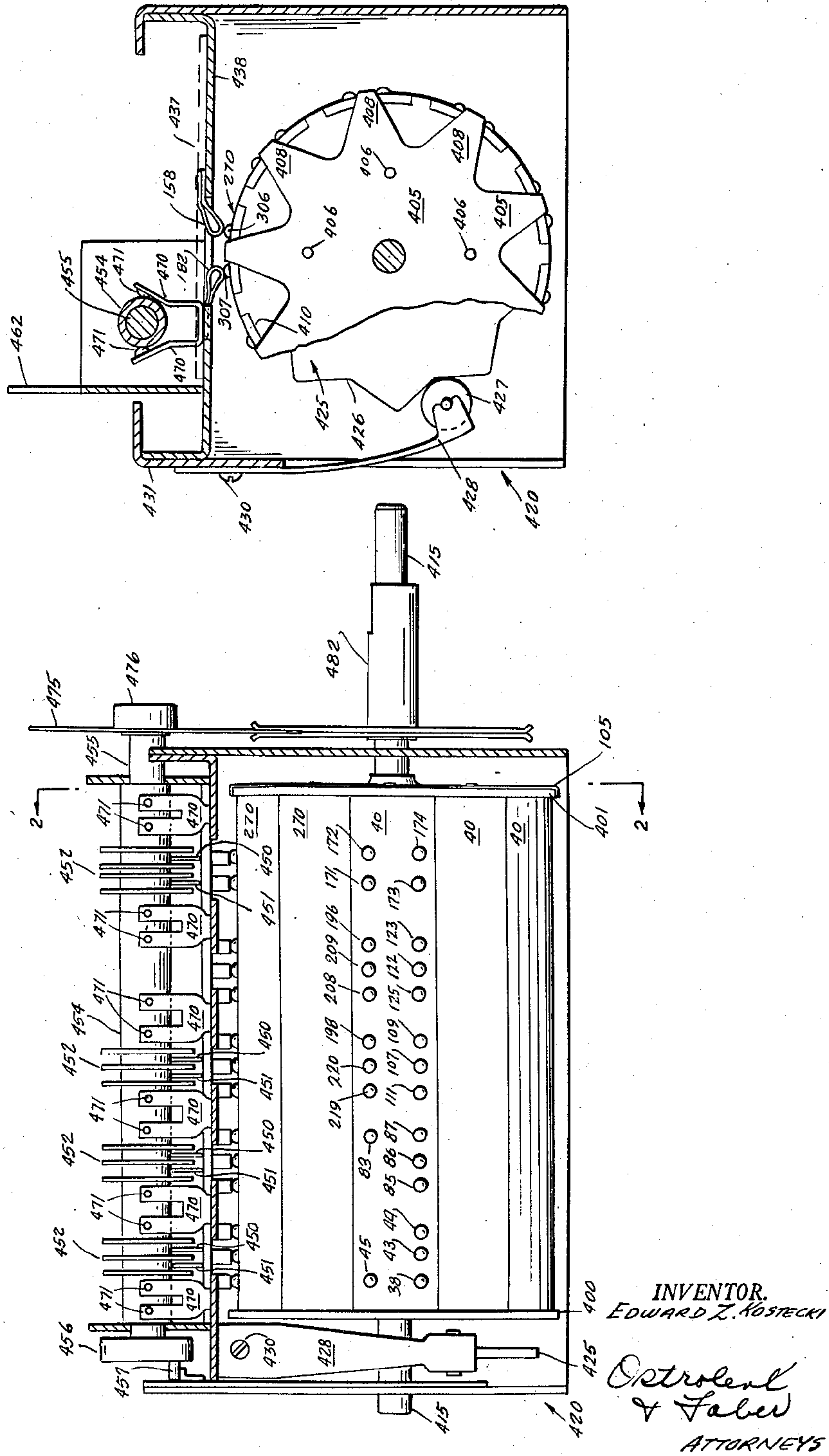
Figure 1 is a side view of the tuner of my present invention showing the turret positioning means and the channel selecting capacitors.
Figure 2 is a cross-sectional view taken on line 10—10 of Figure 1 looking in the direction of the arrows.

Panels 40 and 270 are mounted to form a turret on supporting discs 400 and 401 (see Figures 1, 2, 3, and 5).

Disc 400 (see Figure 5) is provided with a series of openings 402, nine in number in this embodiment, which are engaged by the extensions 381 of panels 40 or 270. The interlocking between extension 381 of panels 40 and 470 and openings 402 of supporting disc 400 is such that panels 40 and 270 may not move either radially or tangentially at the end at which they are provided with extension 381.

Supporting disc 401 is provided instead with circumferential slots 404, also nine in this case, which are engaged by the extension 380 at panels 40 and 270. Supporting disc 401 is also provided with spring disc 405 riveted to disc 401 as shown at 406. Spring disc 405 has in this case nine fingers 408 with a bent portion 409. Bent portion 409 of spring fingers 408 serves to keep panels 40 or 270 from moving radially by biasing extension 380 of panels 40 or 270 against the bottom 410 of slots 404.

Furthermore, slots 412 between slots 404 keep panels 40 or 270 from moving tangentially at the end having the extension 380. Supporting discs 401 are also provided with a tubular member 413 by which they are rigidly secured in any suitable manner. Tubular extensions 413 are in their turn fixedly mounted on shaft 415 so that rotation of shaft 415 causes a similar rotation of supporting discs 400 and 401 and, therefore, of the panel assembly 40—270.

Figure 5:
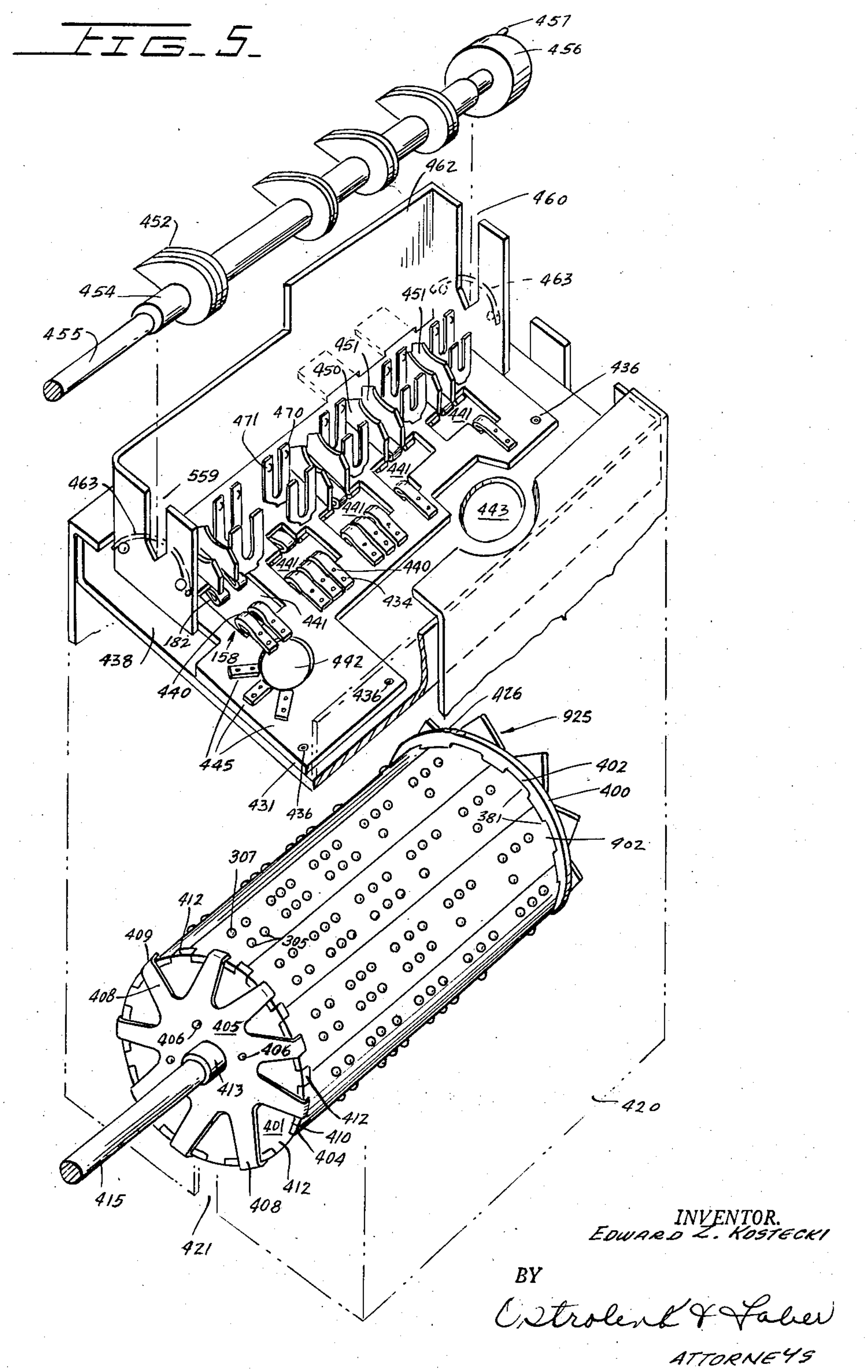
Figure 5 is an exploded view of my novel tuner.

Shaft 415 of the panel structure is mounted on a metallic chassis 420 through openings 421 on each end of chassis 420 as shown schematically in Figure 5 and is secured thereon by any suitable means, for example, a wire spring as is presently done in many switch tuners.

Figure 3:
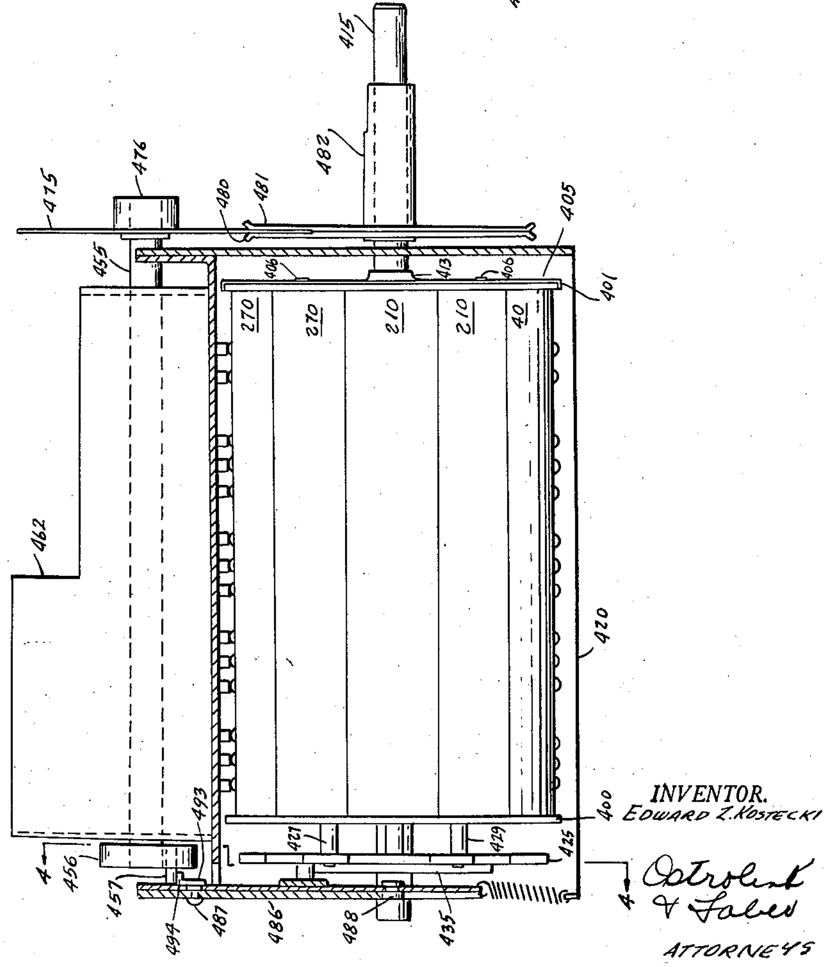
Figure 3 is another side view of the tuner of the present invention showing the cam means for limiting the travel of the control shaft of the variable capacitors.

A positioning disc 425 having notches 426 in alignment with each of the panels 40 or 270 is secured to supporting disc 400 through rivets 429 as can be seen in Figure 3. A roller 427 carried by a spring arm 428 secured by means of screws 430 to one side 431 of chassis 420 serves to position correctly the panels 40 or 270 with respect to the stationary contacts such as 158 and 182 as can be seen in Figure 2. It is known, in fact, that the contact engagement, for example, between the movable contacts 306 and 307 with the stationary contacts 158 and 182 must be very precise in that any angular deviation from the correct position introduces in the circuit a longer path for the current and, therefore, considerable detuning at this high frequency.

Roller 427 is so positioned that when it is in the position shown in Figure 2 the movable contacts such as 306 and 307 engage in the correct position stationary contacts 158 and 182.

Figure 4:
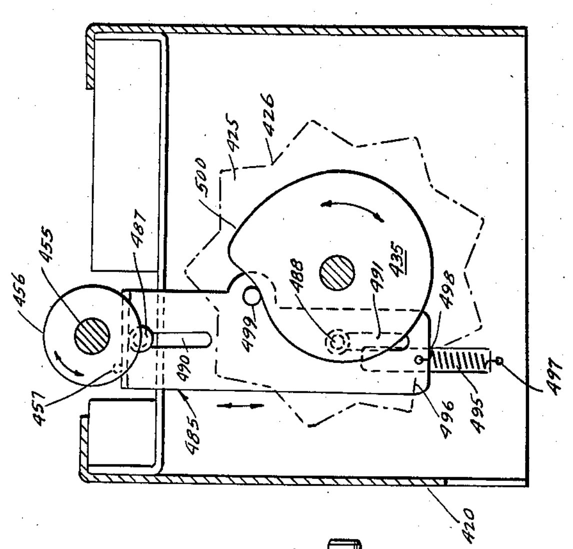
Figure 4 is a cross-sectional view taken along line 12—12 of Figure 3 looking in the direction of the arrows.

A cam member 435 (see Figures 3 and 4) is secured to the scalloped disc 425 through the same rivets 429 which serve to secure scalloped disc 425 to supporting disc 400. Cam 435 performs the function of limiting the travel of the movable members of variable capacitors 30, 31, 93, 94, 118, 120, 183 and 184 as hereinafter described in detail.

As can be seen in Figure 5, the turret assembly carried on shaft 415 is mounted in the lower portion of chassis 420 and more precisely under base board 438. Base board 438 is the metal chassis secured to the sides of chassis 420 in any suitable manner. Base boards 437 and 438 carry all the stationary contacts which, as can be seen from Figure 5, are in the form of kidney springs and are riveted as at 439 to base boards 437 and 438. Base board 437 is of silicon impregnated fiber glass laminate, an insulating material, and is riveted to base board 438 by numerous eyelets 436. The kidney spring contacts such as 32, 33, 95, 96, 113, 115, 127, and 129 are riveted to base board 438. Kidney spring contacts such as 36, 90, 112, 126, 181, 182, 47, 82, 200, 217, 218, 205, 206, 192, 155 and 158 are riveted to fiber glass board 437. The contact making portions 440 of these stationary contacts extend into appropriate openings 441 in base boards 437 and 438 to permit contact engagement between the stationary contacts such as, for example, 158 and 182 and the movable contacts 306 and 307, respectively.

It will also be seen that base boards 437 and 438 are provided with appropriate openings such as 442 and 443, positioning, respectively, the oscillator tube 150 and the cascode single envelope tubes 50—64. Also on the oscillator opening 442 on base board 438 are mounted contacts 445 which permit connection between the terminals of tube 150 and its fixed circuit elements.

The variable capacitances 30, 31, 91, 93, 118, 120, 183 and 184 consists of conductive plates 450 and 451 mounted in any suitable manner on base board 437.

A preselected number of properly shaped dielectric plates 452 are positioned between stationary plates 450 and 451 and between each plate 450 or 451 and the respective grounding elements 470 so that movement of the dielectric plate assembly 452 with respect to the stationary plates 450 and 451 and 470 causes a variation in the capacitance of these capacitors.

More specifically, for example, the variable capacitances 183 and 184 consist of two stationary plates 450 and 451 and four dielectric plates 452. Of these dielectric plates 452, two are positioned as can be seen in Figure 1 between the plates 450 and 451. One is positioned between plate 450 and grounding element 470 at the right of plate 450, while the remaining one is positioned between plate 451 and grounding element 470 at the left of plate 451. All the other variable capacitors are provided with dielectric plates 452, one between the stationary plates 450 and 451 and each of the remaining two between one of the stationary plates and its adjacent grounding element 470.

Dielectric plate assemblies 452 are mounted on conductive cylinder 454 which in its turn is fixedly mounted on a shaft 455. On one end of shaft 455 is mounted a hub 456 carrying pin 457 so that a rotation of shaft 455 causes an equal rotation of dielectric plate assemblies 452 and pin 457.

Shaft 455 is mounted on V-shaped openings 459 and 460 in the frame 462 secured in any suitable way on top of the base board 438. Shaft 455 may be secured in this V-shaped opening in any suitable manner as, for example, by means of wire springs 463 on each end of shaft 455.

Also mounted on base board 438 in alignment with shaft 455 is a series of stationary grounding contacts 470 which are shown U-shaped in the present embodiment. Grounding contacts 470 are made of resilient conductive material and are provided with contact buttons 471 so that as can be seen clearly in Figure 10, contact buttons 471 are always in contact engagement with the outer surface of cylinder 454 carrying dielectric plate assemblies 452.

On shaft 455 is also mounted friction disc 475 which is rigidly secured to shaft 455. Shaft 455 is also engaged by a hub 476 in any suitable manner so that rotation of shaft 455 may be accomplished either by rotation of the frequency disc 475 or hub 476.

Frequency disc 475 is sandwiched between two frequency discs 480 and 481 secured on a sleeve 482. Frequency discs 480 and 481 are made of a resilient material and serve to rotate frequency disc 475 and, therefore, shaft 455 of the dielectric plate assemblies 452 when sleeve 482 is rotated.

Sleeve 482 is a cylinder mounted concentrically on the turret shaft 415. It is now apparent that by providing shaft 415 and sleeve 482 with appropriate concentric knobs (not shown) it is possible to obtain a switching operation through rotation of shaft 415 for selection of a desired band and the tuning operation through rotation of sleeve 482 for continuously selecting a television channel located in a particular band.

As is well-known in the art, while a variation in capacitance of four to one causes a variation in frequency from, for example, 50 to 100 megacycles, a similar variation in capacitance at a higher frequency will encompass a much wider range of frequencies.

Taking, in fact, a frequency of 800 megacycles, it is seen that a variation in capacitance of four to one causes a frequency change from 800 to 1600 megacycles, thus encompassing a frequency range of 900 megacycles instead of the previously mentioned 50 megacycles. This is just by way of example to show why it is necessary to limit the travel of the dielectric plates 452 for continuous tuning as higher and higher frequency channels are desired.

In this particular embodiment, for example, band 5 responds to a frequency range from 470 to 554 megacycles. All the fourteen channels between 14 and 27 may be obtained by a rotation of shaft 455 of dielectric plate assemblies 452 through approximately a rotation of 270°.

When, on the other hand, we have moved shaft 415 so that now my novel tuner is ready to receive channels located in band 9, the frequency range corresponding to band 9 is from 806 to 890 megacycles corresponding to channels 70 to 83. To obtain these 14 channels by rotation of shaft 455 of dielectric plate assemblies 452, it may be sufficient to rotate shaft 455 by an angle smaller than 270°, for example 180°.

It is thus seen that some means must be provided to limit the rotation of shaft 455 and, therefore, the dielectric plates 452 as the bands go to higher and higher frequencies. For this purpose I provide (see Figures 3 and 4) a throw cam 485 located inside chassis 420. On the end wall 486 of chassis 420 are positioned two guides 487 and 488 which engage slots 490 and 491, respectively, in throw cam 485. By making the width of slots 490 and 491 just slightly larger than the cross-sectional dimensions of throw cam 485 it is possible to limit the direction of the movement of throw cam 485 to the vertical direction.

Throw cam 485 is provided at its top portion with an angle 493 whose top surface 494 engages pin 457 on hub 456 and limits action as a stop by movement of pin 457 and, therefore, of shaft 455. Throw cam 485 is biased in one direction by tension spring 495 connected on one side to the end 496 of throw cam 485 opposite its angle 493 and on the other side to the end wall 486 through an opening 497.

In order to position spring 495 in my novel tuner I use a slot 498 on the end wall 486 of the chassis 420. Throw cam 485 is also provided with a cam follower pin 499 suitably connected to throw cam 485 and always in engagement with a surface 500 of cam 435 by the biasing action of spring 495.

Surface 500 of cam 435 which, as previously mentioned, rotates with the turret 40—270 is properly shaped so as to impart the correct displacement to cam 435, thereby limiting the movement of pin 457 and, therefore, the variation in capacitance produced by movement of dielectric plates 452.

To summarize the operation of my novel tuner, when a certain television channel is desired, the operator first moves shaft 415 so that the panel corresponding to the band in which the desired television channel is located engages the stationary contacts and at the same time through simultaneous movement of cam 435 and throw cam 485 is correctly positioned to limit the capacitance variation of the variable capacitors.

In the second operation, the operator by rotating sleeve 482 by any suitable means selects the desired television channel in this particular band.

It will be noted that the two operations are performed by rotation of two concentric knobs (not shown) thus making my novel tuner very simple to operate.

In the foregoing I have described my invention solely in connection with specific illustrative embodiments thereof. Since many variations and modifications of the invention will now be obvious to those skilled in the art, I prefer to be bound not by the specific disclosures herein contained but only by the appended claim.

What is claimed is:

A frequency selector for a wide range of frequencies comprising a turret carrying a plurality of inductance panels, each panel having inductance values for subtending individual bands within the frequency range, variable condenser means mounted in the selector for selective circuital coaction with said panels to tune-in signal frequencies within the band of the selected panel, a capacitor shaft for mechanically displacing a section of said condenser means to effect its capacitive variation, a shaft for rotating said turret to position the panels into the selective circuital coaction, a cam mounted on and rotatable with said turret shaft, a stop member mounted on said capacitor shaft, a member movable by said cam into the path of said stop member for engagement with said stop member to control the angle of rotation of said capacitor shaft in accordance with the selected panel of said turret.

References Cited in the file of this patent

UNITED STATES PATENTS

| | | |
|---|---|---|
| 2,021,843 | Walley | Nov. 19, 1935 |
| 2,103,035 | Lear | Dec. 21, 1937 |
| 2,169,257 | Krebs et al. | Aug. 15, 1939 |
| 2,191,562 | Filippa | Feb. 27, 1940 |
| 2,383,322 | Koch | Aug. 21, 1945 |
| 2,496,183 | Thias | Jan. 31, 1950 |
| 2,503,579 | Fisher | Apr. 11, 1950 |
| 2,545,681 | Zepp | Mar. 20, 1951 |
| 2,584,120 | Fyler | Feb. 5, 1952 |
| 2,584,176 | Wingert | Feb. 5, 1952 |
| 2,596,117 | Bell | May 13, 1952 |
| 2,598,857 | Sziklai | June 3, 1952 |
| 2,613,286 | Hare | Oct. 7, 1952 |
| 2,626,354 | Cheek | Jan. 20, 1953 |
| 2,628,314 | Bussard | Feb. 10, 1953 |
| 2,631,197 | Vilkomerson | Mar. 10, 1953 |
| 2,648,814 | Thias | Aug. 11, 1953 |
| 2,776,376 | Slate | Jan. 1, 1957 |
| 2,791,124 | Gossard | May 7, 1957 |

FOREIGN PATENTS

| | | |
|---|---|---|
| 405,716 | Great Britain | Feb. 15, 1934 |